United States Patent
He et al.

(10) Patent No.: US 7,372,312 B2
(45) Date of Patent: May 13, 2008

(54) PULSE WIDTH MODULATION GENERATING CIRCUIT

(75) Inventors: Feng-Long He, Shenzhen (CN); Yong-Xing You, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 51 days.

(21) Appl. No.: 11/405,076

(22) Filed: Apr. 17, 2006

(65) Prior Publication Data

US 2006/0233232 A1    Oct. 19, 2006

(30) Foreign Application Priority Data

Apr. 15, 2005    (CN) .................... 2005 1 0034246

(51) Int. Cl.
*H03K 3/017* (2006.01)

(52) U.S. Cl. .................... 327/172; 327/176; 327/298

(58) Field of Classification Search .............. None
See application file for complete search history.

(56) References Cited

U.S. PATENT DOCUMENTS

| | | | | |
|---|---|---|---|---|
| 4,517,534 A | * | 5/1985 | Smith | 333/14 |
| 4,628,475 A | | 12/1986 | Azusawa et al. | 708/845 |
| 4,746,820 A | * | 5/1988 | Fey | 327/47 |
| 5,315,260 A | * | 5/1994 | Link et al. | 327/184 |

* cited by examiner

*Primary Examiner*—Kenneth B. Wells
*Assistant Examiner*—An T. Luu
(74) *Attorney, Agent, or Firm*—Morris Manning Martin LLP; Tim Tingkang Xia, Esq.

(57) ABSTRACT

A pulse width modulation (PWM) generating circuit includes a first comparator, a first resistor, a second resistor, a third resistor, a fourth resistor, a capacitor, and a diode. The first resistor and the second resistor are connected in series between a voltage input and ground. The third resistor, the fourth resistor, and the capacitor are connected in series between the voltage input and ground. The first comparator has a non-inverting input connected to a node between the first resistor and the second resistor, an inverting input connected to a node between the fourth resistor and the capacitor, and an output connected to a node between the third resistor and the fourth resistor. The diode is connected between the non-inverting input and the output. The inverting input of the first comparator provides triangular wave signals to a second comparator by which PWM signals are generated.

13 Claims, 1 Drawing Sheet

PULSE WIDTH MODULATION GENERATING CIRCUIT

BACKGROUND OF THE INVENTION

1. Field of the Invention

The present invention relates to a pulse width modulation (PWM) generating circuit, and particularly to a PWM generating circuit with adjustable frequency and adjustable pulse width.

2. General Background

Pulse width modulation (PWM) is broadly used in areas of electronic testing, communication, power controls and so on. For instance, PWM is used on a voltage regulator of a motherboard, a speed control of a fan, and a brightness control of a liquid crystal display. The PWM generating circuit outputs signals whose frequency and pulse width are adjustable.

FIG. 2 shows a relative PWM generating circuit. The PWM generating circuit includes comparators A1, A2, A3. The comparator A1 outputs rectangular wave signals to an inverting input of the comparator A2. The comparator A2 outputs triangular wave signals to a non-inverting input of the comparator A1, for controlling jumping status of an output of the comparator A1. An output of the comparator A2 thereby generates periodic triangular wave signals. A reference voltage and the periodic triangular wave signals are input to the comparator A3, generating PWM signals of adjustable frequency and adjustable pulse width at an output of the comparator A3.

The cost of producing a circuit is an important consideration for manufacturers and circuit designers alike. If the circuit design of a motherboard can be configured with fewer comparator components and still achieve the same functions, the circuit can be produced at a lower cost.

What is needed, therefore, is a PWM generating circuit, which uses fewer comparator components achieving reduced production costs.

SUMMARY

A pulse width modulation (PWM) generating circuit for offering PWM signals is provided. In a preferred embodiment, the PWM generating circuit includes a first comparator, a second comparator, a first resistor, a second resistor, a third resistor, a fourth resistor, a capacitor, and a diode, the first resistor and the second resistor being connected in series between a voltage input and ground, a node between the first resistor and the second resistor being connected to a non-inverting input of the first comparator; the third resistor, the fourth resistor, and the capacitor being connected in series between the voltage input and ground, a node between the fourth resistor and the capacitor being connected to an inverting input of the first comparator, and a node between the third resistor and the fourth resistor being connected to an output of the first comparator; the diode having an anode connected to the non-inverting input of the first comparator, and a cathode connected to the output of the first comparator; the second comparator having a non-inverting input receiving a reference voltage, an inverting input connected to the inverting input of the first comparator, and an output connected to the voltage input via a fifth resistor, the inverting input of the first comparator offering triangular wave signals to the second comparator, the output of the second comparator generating PWM signals. It is of advantage that the PWM generating circuit uses less electrical components, economizing on the cost of the generating circuit while still assuring the usual function of the generating circuit.

Other advantages and novel features will become more apparent from the following detailed description of preferred embodiments when taken in conjunction with the accompanying drawings, in which:

DETAILED DESCRIPTION OF THE EMBODIMENT

Figure 1:
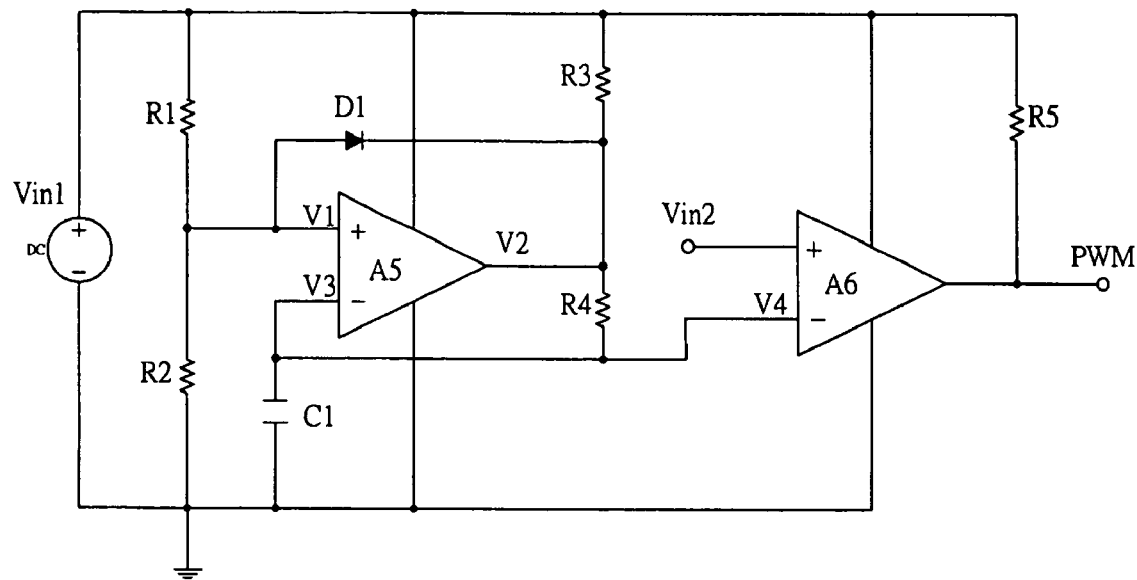
FIG. 1 is a circuit diagram of a PWM generating circuit in accordance with a preferred embodiment of the present invention.
Figure 2:
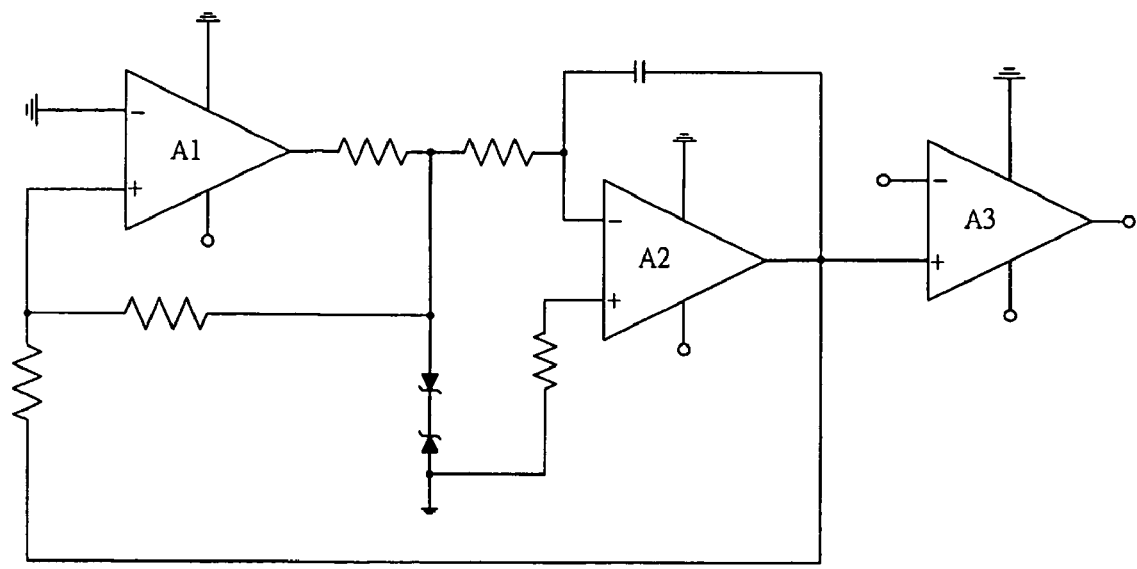
FIG. 2 is a circuit diagram of a relative PWM generating circuit.

FIG. 1 shows a PWM generating circuit in accordance with a preferred embodiment of the present invention. The PWM generating circuit includes a triangular wave generator. The triangular wave generator includes a voltage input Vin1, a first comparator A5, a first resistor R1, a second resistor R2, a third resistor R3, a fourth resistor R4, a capacitor C1, and a diode D1. The first resistor R1 and the second resistor R2 are connected in series between the voltage input Vin1 and ground. The third resistor R3, the fourth resistor R4, and the capacitor C1 are connected in series between the voltage input Vin1 and ground. The first comparator A5 has a non-inverting input connected to a node between the first resistor R1 and the second resistor R2, an inverting input connected to a node between the fourth resistor R4 and the capacitor C1, and an output connected to a node between the third resistor R3 and the fourth resistor R4. The diode D1 has an anode connected to the non-inverting input of the comparator A5, and a cathode connected to the output of the comparator A5.

The voltage input Vin1 supplies a reference voltage V1 to the non-inverting input of the comparator A5 via the node between the first resistor R1 and the second resistor R2. When the voltage input Vin1 receives a direct current voltage, for example, 5 volts, a voltage V3 over the capacitor C1 is zero, and a voltage V2 output from the comparator A5 approaches the voltage input Vin1 in value, being at a high level. The diode D1 is turned off because the reference voltage V1 is less than the voltage V2. The voltage input Vin1 thereby charges the capacitor C1 via the third resistor R3 and the fourth resistor R4. The voltage V3 over the capacitor C1 increases over time. When the voltage V3 is greater than the reference voltage V1 in value, the voltage V2 output from the comparator A5 drops to a low level, and then the reference voltage V1 is greater than the voltage V2 in value. The diode D1 is thereby turned on. Then the capacitor C1 begins discharging via the fourth resistor R4 and the comparator A5, and the voltage V3 decreases over time. When the voltage V3 is less than the reference voltage V1, the voltage V2 raises to a high level, and then the voltage input Vin1 charges the capacitor C1 again. In such a circle, the inverting input of the comparator A5 generates triangular wave signals.

The PWM generating circuit further includes a second comparator A6. An inverting input of the second comparator A6 is connected to the inverting input of the first comparator A5. An output of the second comparator A6 is connected to the voltage input Vin1 via a fifth resistor R5. A reference voltage Vin2 of a non-inverting input of the comparator A6 is compared with a voltage V4 of the inverting input of the second comparator A6. The output of the second comparator A6 outputs PWM signals.

The charge time or discharge time of the capacitor C1 is controlled by the third resistor R3, the fourth resistor R4, and the capacitor C1. Therefore the triangular wave generator generates triangular wave signals of different frequency via selecting different values of the third resistor R3, the fourth resistor R4, and the capacitor C1. The PWM generating circuit can thereby generate PWM signals of different frequencies. The triangular wave generator generates triangular wave signals of different amplitude via selecting different values of the first resistor R1, the second resistor R2, and the voltage input Vin1. The PWM generating circuit thereby generates PWM signals of different pulse widths. When the inverting input of the comparator A6 inputs signals with constant frequency and amplitude, and the reference voltage Vin2 is changed, the PWM generating circuit also generates PWM signals of different pulse widths.

The triangular wave generator is not only used for the PWM generating circuit, but also for other signal sources for automatic controls, automatic testing and so on.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A pulse width modulation (PWM) generating circuit comprising:
   a voltage input;
   a first comparator having a non-inverting input, an inverting input, and an output;
   a first resistor and a second resistor connected in series between the voltage input and ground, a node between the first resistor and the second resistor connected to the non-inverting input of the first comparator;
   a third resistor, a fourth resistor, and a capacitor connected in series between the voltage input and ground, a node between the fourth resistor and the capacitor connected to the inverting input of the first comparator, and a node between the third resistor and the fourth resistor connected to the output of the first comparator;
   a diode having an anode connected to the non-inverting input of the first comparator, and a cathode connected to the output of the first comparator; and
   a second comparator having a non-inverting input receiving a reference voltage, an inverting input connected to the inverting input of the first comparator, and an output connected to the voltage input via a fifth resistor, the output of the second comparator outputting PWM signals.

2. The PWM generating circuit as claimed in claim 1, wherein the voltage input receives a 5 volt voltage.

3. The PWM generating circuit as claimed in claim 1, wherein the PWM generating circuit generates PWM signals of different frequencies via selecting different values of the third resistor, the fourth resistor, and the capacitor.

4. The PWM generating circuit as claimed in claim 1, wherein the PWM generating circuit generates PWM signals of different pulse widths via selecting different values of the first resistor, the second resistor, and the voltage input.

5. The PWM generating circuit as claimed in claim 1, wherein the PWM generating circuit generates PWM signals of different pulse widths via changing the reference voltage.

6. A triangular wave generator comprising:
   a voltage input;
   a comparator having a non-inverting input, an inverting input, and an output;
   a first resistor and a second resistor connected in series between the voltage input and ground, a node between the first resistor and the second resistor connected to the non-inverting input of the comparator;
   a third resistor, a fourth resistor, and a capacitor connected in series between the voltage input and ground, a node between the fourth resistor and the capacitor connected to the inverting input of the comparator, and a node between the third resistor and the fourth resistor connected to the output of the comparator; and
   a diode having an anode connected to the non-inverting input of the comparator, and a cathode connected to the output of the comparator, the inverting input of the comparator outputting triangular wave signals.

7. The triangular wave generator as claimed in claim 6, wherein the voltage input receives a 5 volt voltage.

8. The triangular wave generator as claimed in claim 6, wherein the triangular wave generator generates the triangular wave signals of different frequencies via selecting different values of the third resistor, the fourth resistor, and the capacitor.

9. The triangular wave generator as claimed in claim 6, wherein the triangular wave generator generates the triangular wave signals of different amplitudes via selecting different values of the first resistor, the second resistor, and the voltage input.

10. A signal generator comprising:
    a voltage input;
    a capacitor electrically connectable with said voltage input so as to be electrically chargeable by said voltage input and dischargeable therefrom;
    a comparator comprising a non-inverting input electrically connectable with said voltage input and an inverting input electrically connectable with ground via said capacitor so as to receive voltage signals from said voltage input and said capacitor respectively; and
    a diode electrically connectable directly between said non-inverting input of said comparator with said voltage input and an output of said comparator in order for generating pulse width modulation (PWM) signals together with said comparator based on a comparative result of said comparator due to said voltage signals from said voltage input and said capacitor respectively.

11. The signal generator as claimed in claim 10, further comprising another comparator electrically connectable with said output of said comparator and a reference voltage input respectively in order to receive said PWM signals from said output of said comparator and reference voltage signals from said reference voltage input so as to regulate pulse widths of said PWM signals based on said reference voltage signals.

12. The signal generator as claimed in claim 10, further comprising a resistor electrically connectable with said capacitor in series between said output of said comparator and said capacitor.

13. The signal generator as claimed in claim 12, further comprising another resistor electrically connectable with said capacitor in series between said voltage input and said diode.

* * * * *